US012610619B2

(12) United States Patent
Zhang et al.

(10) Patent No.: US 12,610,619 B2
(45) Date of Patent: Apr. 21, 2026

(54) DISPLAY SUBSTRATE COMPRISING A PLURALITY OF SPACERS EACH COMPRISING AN ALTERNATING STACK OF ORGANIC AND INORGANIC SUB-PATTERNS, MANUFACTURE METHOD THEREOF AND DISPLAY DEVICE

(71) Applicant: BOE TECHNOLOGY GROUP CO., LTD., Beijing (CN)

(72) Inventors: Jinchao Zhang, Beijing (CN); Hui Guo, Beijing (CN); Lizhong Wang, Beijing (CN); Rui Huang, Beijing (CN); Guoteng Li, Beijing (CN); Ce Ning, Beijing (CN); Yong Yu, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 158 days.

(21) Appl. No.: 18/027,356

(22) PCT Filed: Jun. 29, 2022

(86) PCT No.: PCT/CN2022/102300
§ 371 (c)(1),
(2) Date: Mar. 20, 2023

(87) PCT Pub. No.: WO2024/000252
PCT Pub. Date: Jan. 4, 2024

(65) Prior Publication Data
US 2024/0355837 A1     Oct. 24, 2024

(51) Int. Cl.
*H10D 86/60* (2025.01)
*G02F 1/1333* (2006.01)
(Continued)

(52) U.S. Cl.
CPC ....... *H10D 86/60* (2025.01); *G02F 1/133357* (2021.01); *G02F 1/13394* (2013.01);
(Continued)

(58) Field of Classification Search
CPC ................................................. G02F 1/133357
See application file for complete search history.

(56) References Cited

U.S. PATENT DOCUMENTS

| | | | |
|---|---|---|---|
| 2007/0103635 A1 | 5/2007 | Tawaraya et al. | |
| 2013/0001620 A1* | 1/2013 | Sugisawa ............. | H10K 59/122 257/E33.062 |

FOREIGN PATENT DOCUMENTS

| | | |
|---|---|---|
| CN | 102902108 A | 1/2013 |
| CN | 104777661 A | 7/2015 |

(Continued)

*Primary Examiner* — Paul C Lee
(74) *Attorney, Agent, or Firm* — HOUTTEMAN LAW LLC

(57) ABSTRACT

The present disclosure provides a display substrate, including: a base substrate; and a plurality of spacers on a side of the base substrate and each comprising at least one first sub-pattern and at least one second sub-pattern stacked along a normal direction of the base substrate, the first sub-pattern being made of an organic material and the second sub-pattern being made of an inorganic material. The present disclosure also provides a method for manufacturing the display substrate and a display device.

17 Claims, 8 Drawing Sheets

(51) Int. Cl.
| | | |
|---|---|---|
| *G02F 1/1339* | (2006.01) | |
| *G02F 1/1362* | (2006.01) | |
| *H10D 86/01* | (2025.01) | |
| *H10D 86/40* | (2025.01) | |

(52) U.S. Cl.
CPC ....... *G02F 1/1362* (2013.01); *H10D 86/0231* (2025.01); *H10D 86/451* (2025.01)

(56)                References Cited

FOREIGN PATENT DOCUMENTS

| | | | | | |
|---|---|---|---|---|---|
| CN | 105158985 | A | * | 12/2015 | ......... G02F 1/13394 |
| CN | 109298590 | B | | 7/2020 | |
| CN | 113721382 | A | * | 11/2021 | |
| CN | 113867055 | A | * | 12/2021 | |

* cited by examiner

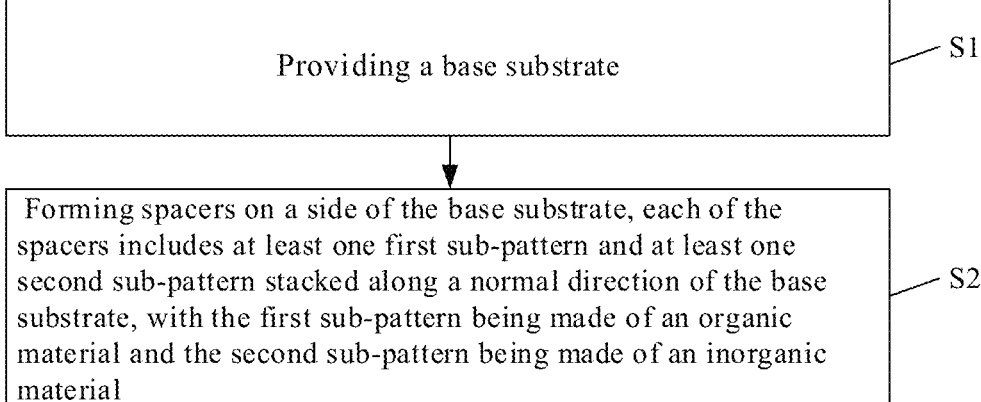

Providing a base substrate ⟋ S1

Forming spacers on a side of the base substrate, each of the spacers includes at least one first sub-pattern and at least one second sub-pattern stacked along a normal direction of the base substrate, with the first sub-pattern being made of an organic material and the second sub-pattern being made of an inorganic material ⟋ S2

FIG.8

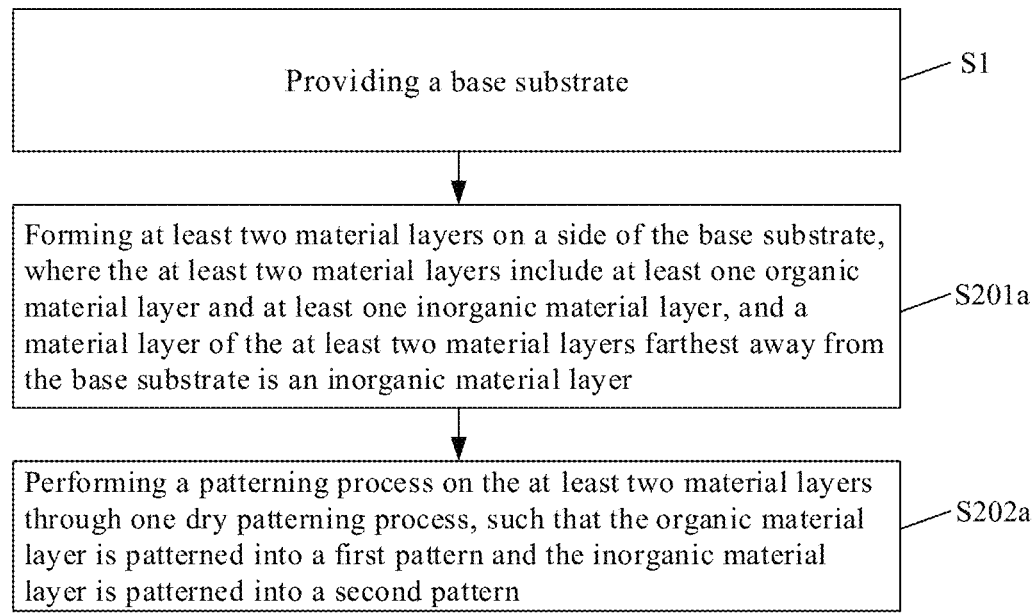

Providing a base substrate ⟋ S1

Forming at least two material layers on a side of the base substrate, where the at least two material layers include at least one organic material layer and at least one inorganic material layer, and a material layer of the at least two material layers farthest away from the base substrate is an inorganic material layer ⟋ S201a Performing a patterning process on the at least two material layers through one dry patterning process, such that the organic material layer is patterned into a first pattern and the inorganic material layer is patterned into a second pattern ⟋ S202a

FIG.9

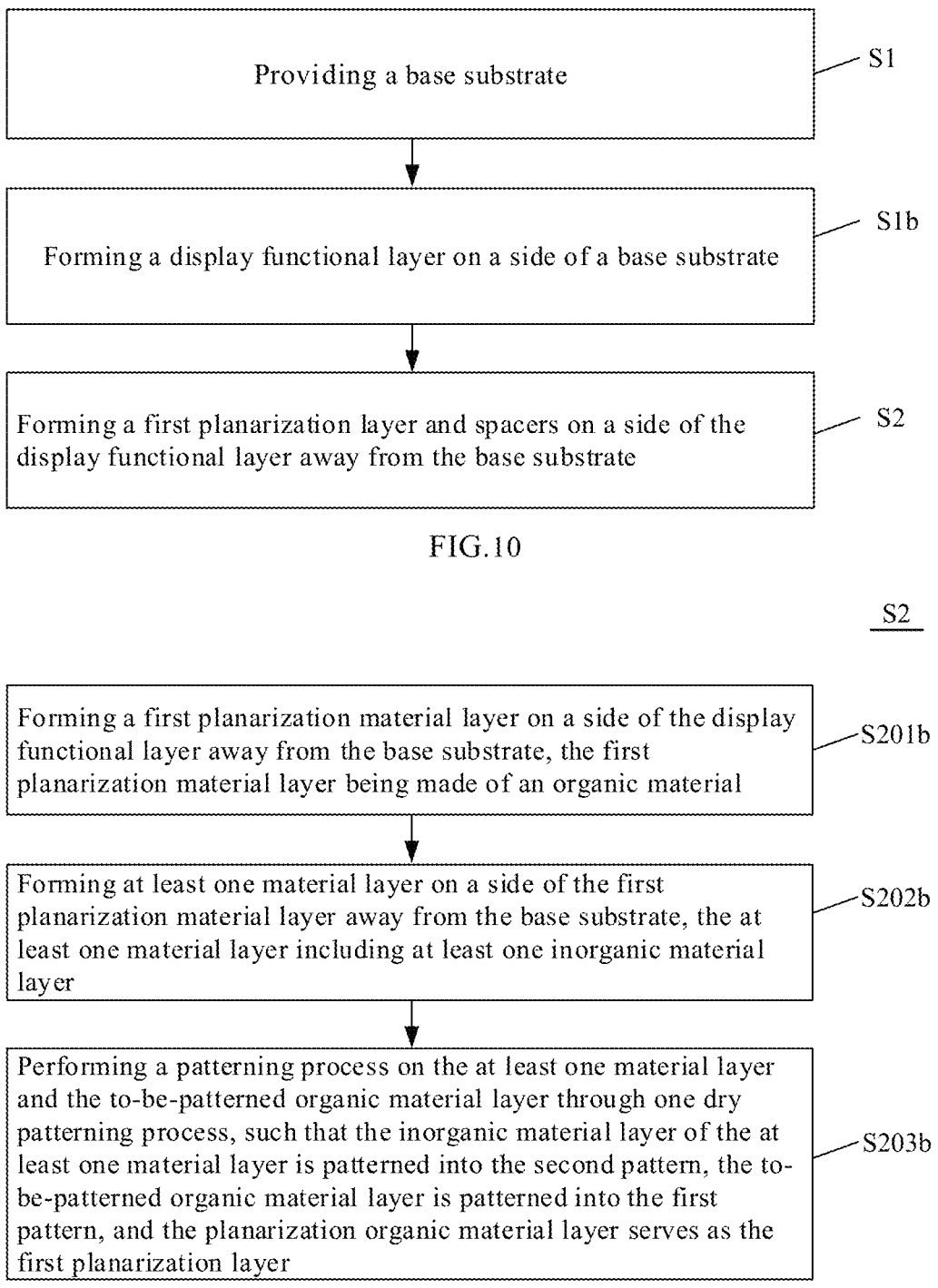

Providing a base substrate                                                                  S1

Forming a display functional layer on a side of a base substrate                            S1b Forming a first planarization layer and spacers on a side of the
display functional layer away from the base substrate                                       S2

Forming a first planarization material layer on a side of the display
functional layer away from the base substrate, the first
planarization material layer being made of an organic material                              S201b Forming at least one material layer on a side of the first
planarization material layer away from the base substrate, the at
least one material layer including at least one inorganic material
layer                                                                                       S202b Performing a patterning process on the at least one material layer
and the to-be-patterned organic material layer through one dry
patterning process, such that the inorganic material layer of the at
least one material layer is patterned into the second pattern, the to-                       S203b
be-patterned organic material layer is patterned into the first
pattern, and the planarization organic material layer serves as the
first planarization layer

FIG.11

DISPLAY SUBSTRATE COMPRISING A PLURALITY OF SPACERS EACH COMPRISING AN ALTERNATING STACK OF ORGANIC AND INORGANIC SUB-PATTERNS, MANUFACTURE METHOD THEREOF AND DISPLAY DEVICE

TECHNICAL FIELD

The present disclosure relates to the field of display, in particular, to a display substrate, a manufacture method thereof and a display device.

BACKGROUND

Liquid Crystal Display (LCD) generally includes an array substrate and a color filter substrate facing each other, and a liquid crystal layer disposed between the array substrate and the color filter substrate. In order to ensure the thickness uniformity of the whole display screen, photo spacers (PS) are further disposed between the array substrate and the color filter substrate for supporting the color filter substrate and the array substrate.

SUMMARY

As a first aspect, an embodiment of the present disclosure provides a display substrate including: a base substrate; and a plurality of spacers on a side of the base substrate and each comprising at least one first sub-pattern and at least one second sub-pattern stacked along a normal direction of the base substrate, the first sub-pattern being made of an organic material and the second sub-pattern being made of an inorganic material.

In some embodiments, a sub-pattern of each of the plurality of spacers farthest away from the base substrate is the second sub-pattern.

In some embodiments, the display substrate further includes: a display functional layer between the base substrate and the spacers; and a first planarization layer between the display functional layer and the spacers, wherein the first planarization layer includes an organic material.

In some embodiments, a sub-pattern of each of the plurality of spacers most proximal to the base substrate is the first sub-pattern, and the sub-pattern of each of the plurality of spacers most proximal to the base substrate has the same material as the first planarization layer.

In some embodiments, the display substrate further includes a second planarization layer between the display functional layer and the first planarization layer, wherein the second planarization layer includes an inorganic material.

In some embodiments, each of the plurality of spacers has only one first sub-pattern, and each of the plurality of spacers has only one second sub-pattern.

In some embodiments, each of the plurality of spacers includes a plurality of first sub-patterns and a plurality of second sub-patterns stacked alternately.

In some embodiments, each of the plurality of spacers has two to four second sub-patterns.

In some embodiments, the first sub-pattern includes a first surface and a second surface oppositely disposed in the normal direction of the base substrate, and the first surface is closer to the base substrate than the second surface. The second sub-pattern includes a third surface and a fourth surface oppositely disposed in the normal direction of the base substrate, the third surface is closer to the base substrate than the fourth surface. For the first sub-pattern in the spacer and the second sub-pattern adjacent to the first sub-pattern and located on a side of the first sub-pattern away from the base substrate, an orthographic projection of the second surface of the second sub-pattern on the base substrate falls within an orthographic projection of the third surface of the first sub-pattern on the base substrate.

In some embodiments, the first sub-pattern includes a first surface and a second surface oppositely disposed in the normal direction of the base substrate, wherein the first surface is closer to the base substrate than the second surface, and the first sub-pattern further includes a first sidewall between the first surface and the second surface. The second sub-pattern includes a third surface and a fourth surface oppositely disposed in the normal direction of the base substrate, wherein the third surface is closer to the base substrate than the fourth surface, and the second sub-pattern further includes a second sidewall between the third surface and the fourth surface, and an inclination angle formed between the first sidewall and the first surface is smaller than or equal to an inclination angle formed between the second sidewall and the third surface.

In some embodiments, the first sidewall and the first surface form the inclination angle in a range from 50° to 90° therebetween, and the second sidewall and the third surface form the inclination angle in a range from 75° to 90° therebetween.

In some embodiments, a ratio of a sum of thicknesses of all the first sub-patterns of the spacer to a sum of thicknesses of all the second sub-patterns of the spacer ranges from 1:1 to 10:1.

In some embodiments, the first sub-pattern has an elastic recovery greater than or equal to 75%.

In some embodiments, the first sub-pattern includes a resin material. The second sub-pattern includes at least one of silicon oxide or silicon nitride.

In some embodiments, the display substrate is an array substrate or a color filter substrate.

As a second aspect, an embodiment of the present disclosure provides a display device, including: a display substrate provided in the first aspect and a counter substrate opposite to the display substrate.

As a third aspect, an embodiment of the present disclosure provides a method for manufacturing the display substrate according to the first aspect, including: providing a base substrate; and forming a plurality of spacers on a side of the base substrate, wherein each of the plurality of spacers includes at least one first sub-pattern and at least one second sub-pattern stacked along a normal direction of the base substrate, with the first sub-pattern being made of an organic material and the second sub-pattern being made of an inorganic material.

In some embodiments, forming the plurality of spacers on the side of the base substrate includes forming at least two material layers on the side of the base substrate, wherein the at least two material layers include at least one organic material layer and at least one inorganic material layer, and a material layer of the at least two material layers farthest away from the base substrate is an inorganic material layer; and performing a patterning process on the at least two material layers through one dry patterning process, such that the organic material layer is patterned into the first pattern and the inorganic material layer is patterned into the second pattern.

In some embodiments, after providing the base substrate, the method further includes: forming a display functional layer on a side of the base substrate; and forming a first planarization layer on a side of the display functional layer away from the base substrate.

In some embodiments, forming the first planarization layer and forming the plurality of spacers comprise: forming a first planarization material layer on a side of the display functional layer away from the base substrate, the first planarization material layer being made of an organic material and including a planarization organic material layer and a to-be-patterned organic material layer on a side of the planarization organic material layer away from the base substrate; forming at least one material layer on a side of the first planarization material layer away from the base substrate, wherein the at least one material layer includes at least one inorganic material layer; and performing a patterning process on the at least one material layer and the to-be-patterned organic material layer through one dry patterning process, such that the at least one inorganic material layer of the at least one material layer is patterned into the second pattern, the to-be-patterned organic material layer is patterned into the first pattern, and the planarization organic material layer is formed as the first planarization layer.

In some embodiments, the at least one material layer further includes at least one organic material layer. During the process of performing the patterning process on the at least one material layer and the to-be-patterned organic material layer through the one dry patterning process, the at least one organic material of the at least one material layer is patterned into the first pattern.

In some embodiments, before forming the first planarization layer on the side of the display functional layer away from the base substrate, the method further includes forming a second planarization layer on a side of the display functional layer away from the base substrate, the second planarization layer including an inorganic material.

BRIEF DESCRIPTION OF DRAWINGS

FIG. 8 is a flowchart of a method for manufacturing a display substrate according to an embodiment of the present disclosure;

FIG. 9 is a flowchart of a method for manufacturing a display substrate according to another embodiment of the present disclosure;

FIG. 10 is a flowchart of a method for manufacturing a display substrate according to another embodiment of the present disclosure;

FIG. 11 is a flowchart of an alternative implementation method for forming a first planarization layer and spacers on a side of a display functional layer away from a base substrate according to an embodiment of the present disclosure;

DETAIL DESCRIPTION OF EMBODIMENTS

Figure 1A:
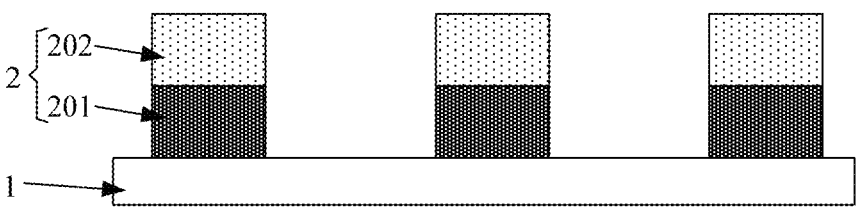
FIG. 1A is a schematic cross-sectional view of a display substrate according to an embodiment of the present disclosure.

In order to enable those skilled in the art to better understand the technical solutions of the present disclosure, the present disclosure will be further described in detail below in conjunction with the drawings and specific embodiments.

The present disclosure will be described in more detail below with reference to the accompanying drawings. In the drawings, the same elements are represented by similar reference numerals. For the sake of clarity, all parts in the drawings are not drawn to scale. In addition, some well-known parts may not be shown in the drawings.

Many specific details of the present disclosure, such as the structure, material, size, processing technology and technology of components, are described below in order to better understand the present disclosure. However, as those skilled in the art can understand, the present disclosure can be implemented without following these specific details.

In the expression of the range of A to B in the present disclosure, the defined range includes both the endpoint values A and B.

In the embodiment of the present disclosure, the patterning process generally includes photoresist coating, exposure, development, etching, photoresist stripping, etc. In addition, when some organic material layers are patterned, the organic material layers may be directly exposed and developed to obtain the corresponding patterns without the photoresist coating.

The traditional spacers generally are made of organic materials. Specifically, an organic material layer for manufacturing the spacers is directly exposed by an exposure machine, and then the organic material layer is developed by a developing solution (i.e., a wet patterning process) to obtain a pattern of the spacers. However, the spacers made of the organic material layer has the following disadvantages: 1) the spacers tend to be crushed during the process of forming a cell or when the liquid crystal display panel is pressed; and 2) the spacers are difficult to be small-sized.

It is found through research that although organic materials have good elasticity, their compressive strength is poor, so that the spacers made of the organic materials have poor compression strength and tend to be crushed during the process of forming a cell or when the liquid crystal display panel is pressed. The compressive strength refers to the maximum compressive stress that the specimen bears during the compression test until specimen breaks (e.g., a brittle material) or yields (e.g., a non-brittle material).

In addition, since the organic material layer is a flexible layer, in order to ensure that the resulted spacer can stably stand, the cross section area of the spacer cannot be designed to be too small. A ratio of the cross-sectional area of the spacer to a height of the spacer is generally required to be greater than or equal to a certain critical value, and the critical value is related to factors such as the specific organic material, the environment where the spacer is located, or the like. That is, the minimum cross-sectional area of the spacer made of the organic material is limited by the height of the spacer. However, the height of the spacer in the current liquid crystal display device is generally higher (e.g., at the micron level), therefore the minimum cross-sectional area of the spacer formed actually is also relatively larger, so that the spacer is difficult to be miniaturized.

In order to solve at least one of the technical problems described above in the prior art, the present disclosure provides a display substrate, a manufacture method thereof and a display device.

Figure 1B:
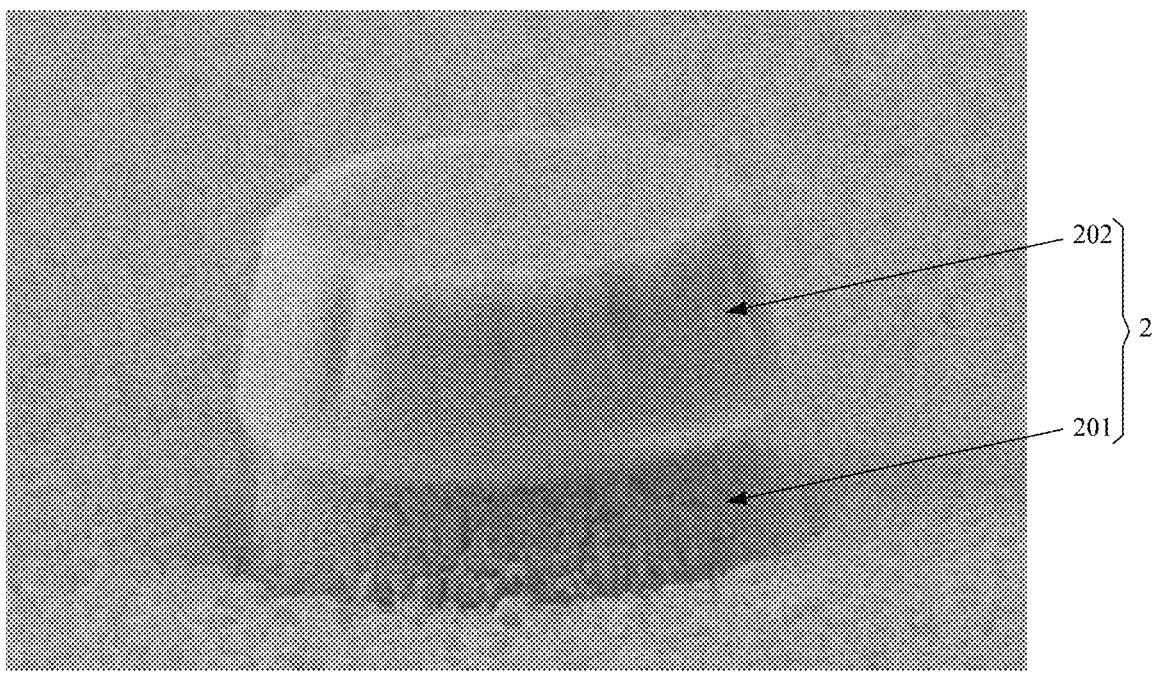
FIG. 1B is a scanning electron micrograph of a spacer according to an embodiment of the present disclosure.

FIG. 1A is a schematic cross-sectional view of a display substrate according to an embodiment of the present disclosure. FIG. 1B is a scanning electron micrograph of a spacer according to an embodiment of the present disclosure. As shown in FIG. 1A and FIG. 1B, the display substrate includes a base substrate 1 and spacers 2. The spacers 2 are located on a side of base substrate 1, and each of the spacers 2 includes: at least one first sub-pattern 201 and at least one second sub-pattern 202 that are stacked along a normal direction of the base substrate 1. The material of the first sub-pattern 201 is an organic material, and the material of the second sub-pattern 202 is an inorganic material.

In the embodiment of the present disclosure, by designing the spacer as a stacked structure including the first sub-pattern 201 made of the organic material and the second sub-pattern 202 made of the inorganic material, on one hand the first sub-pattern 201 made of the organic material has a better elasticity, and the second sub-pattern 202 made of the inorganic material has a better compressive strength, so that the spacer 2 has a better elasticity and a better compressive strength; on the other hand since the second sub-pattern 202 made of an inorganic material is introduced into the spacer 2, and in this case the thickness of the first sub-pattern 201 made of an organic material is smaller than the overall height of the spacer 2, therefore as compared with the related art in which the thickness of the organic material in the spacer in is equal to the height of the spacer, the thickness of the organic material in the spacer 2 in the embodiment of the present disclosure can be effectively decreased, and as a result, the minimum cross-sectional area of the second sub-pattern 202 made of an organic material in the embodiment of the present disclosure is smaller than the minimum cross-sectional area of the spacer 2 in the related art. That is to say, if the height of the spacer 2 is constant, the cross-sectional area of the spacer 2 in the embodiment of the present disclosure may be smaller than the minimum cross-sectional area of the spacer in the related art, thereby realizing size-decreased spacer 2.

In some embodiments, a sub-pattern of the spacer 2 farthest away from the base substrate is the second sub-pattern 202. With the design, it is convenient to pattern the organic material layer for the first sub-pattern 201 and the inorganic material layer for the second sub-pattern 202 through one dry patterning process. The second sub-pattern 202 positioned uppermost in the spacer 2 may provide a hard mask for the organic material layer for forming the first sub-pattern 201 thereunder. Further details thereof will be described below in conjunction with specific method embodiments.

As shown in FIG. 1A and FIG. 1B, an embodiment in which one spacer 2 includes only one first sub-pattern 201 and only one second sub-pattern 202 is shown as an example, which does not limit the technical solution of the present disclosure.

Figure 2:
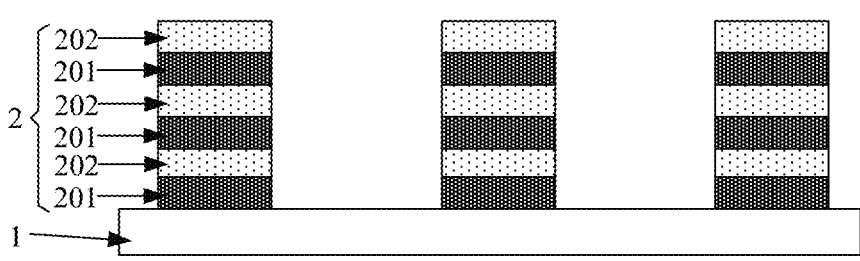
FIG. 2 is a schematic cross-sectional view of a display substrate according to another embodiment of the present disclosure.

FIG. 2 is a schematic cross-sectional view of a display substrate according to another embodiment of the present disclosure. As shown in FIG. 2, unlike the previous embodiment in which one spacer 2 includes only one first sub-pattern 201 and only one second sub-pattern 202, in the embodiment of the present disclosure one spacer 2 includes a plurality of first sub-patterns 201 and a plurality of second sub-patterns 202 alternately stacked.

When the spacer 2 is compressed, the compressive stress is mainly concentrated on the first sub-pattern 201 made of the organic material. Taking the embodiment shown in FIG. 1A as an example, when the spacer 2 is compressed, the compressive stress is concentrated on the first sub-pattern 201 located at the lower portion of the spacer 2, so that the unevenly distributed compressive stress exists. In FIG. 2, the plurality of first sub-patterns 201 are distributed at different heights of the spacer 2, so that the compressive stress is distributed in the plurality of first sub-patterns 201 when the spacer 2 is compressed. That is, the compressive stress can be effectively dispersed at different heights of the spacer 2, so as to effectively improve the concentration of the compressive stress.

In the embodiment of the present disclosure, the more the second sub-patterns 202 are, the more the corresponding first sub-patterns 201 are formed, and the better the effect of stress dispersion is. However, the more complex the structure of spacer 2 is, the more complex the manufacture process is. Based on the consideration of the stress dispersion effect and the complexity of the manufacture process, the number of the second sub-patterns 202 in the spacer 2 is 2 to 4.

In addition, FIG. 2 only shows an embodiment in which the spacer 2 includes three first sub-patterns 201 and three second sub-patterns 202 as an example, which does not limit the technical solution of the present disclosure.

Figure 3:
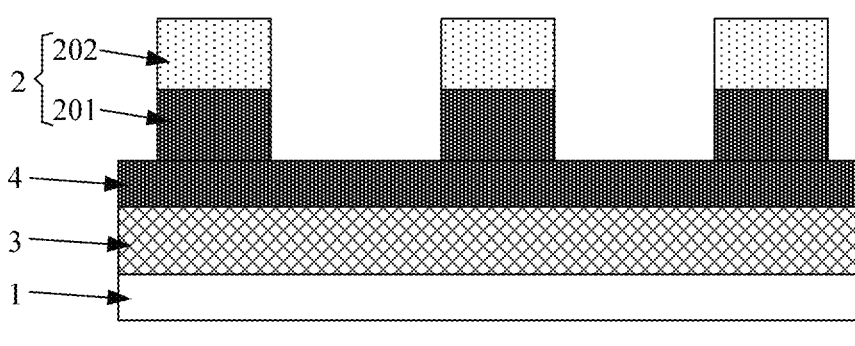
FIG. 3 is a schematic cross-sectional view of a display substrate according to another embodiment of the present disclosure.
Figure 4:
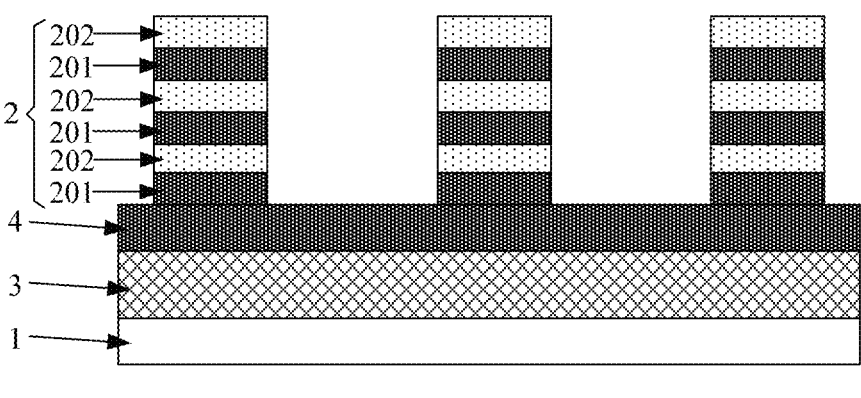
FIG. 4 is a schematic cross-sectional view of a display substrate according to another embodiment of the present disclosure.

FIG. 3 is a schematic cross-sectional view of a display substrate according to another embodiment of the present disclosure. FIG. 4 is a schematic cross-sectional view of a display substrate according to another embodiment of the present disclosure. As shown in FIG. 3 and FIG. 4, in some embodiments, the display substrate further includes a display functional layer 3 and a first planarization layer 4.

The display functional layer 3 is between the base substrate and the spacers 2. The first planarization layer 4 is located between the display functional layer 3 and the spacers 2, and the material of the first planarization layer 4 includes an organic material.

In the embodiment of the present disclosure, the display functional layer 3 refers to the functional structure layers for the display function in the display substrate.

As an example, the display substrate is a color filter substrate, and the display functional layer 3 generally includes a color film layer including a black matrix and a color film pattern. If the common electrode is also disposed on the color filter substrate, the display functional layer 3 includes not only the color filter layer but also the common electrode. Since a surface of the color film layer away from the base substrate is an uneven surface, a planarization layer (i.e., the first planarization layer 4 described above) needs to be formed on the surface of the color film layer away from the base substrate in order to ensure a constant thickness of the liquid crystal cell.

As another example, the display substrate is an array substrate, and the display functional layer 3 generally includes a pixel circuit layer (including a thin film transistor, a capacitor, a pixel electrode, or the like). Since a surface of the pixel circuit layer away from the base substrate is an uneven surface, a planarization layer (i.e., the first planarization layer 4 described above) needs to be formed on the surface of the pixel circuit layer away from the base substrate in order to ensure a constant thickness of the liquid crystal cell.

The specific structure of the display functional layer 3 in the embodiments of the present disclosure is not limited thereto.

In some embodiments, a sub-pattern of the spacer 2 most proximal to the base substrate is the first sub-pattern 201, and the material of the sub-pattern of the spacer 2 most proximal to the base substrate is the same as the material of the first planarization layer 4. With the design, the first sub-pattern 201 can be formed by a portion of in the existing first planarization layer 4, thereby simplifying the manufacture process of the display substrate.

It should be noted that in the embodiment of the present disclosure, when the sub-pattern of the spacer 2 most proximal to the base substrate is the first sub-pattern 201, the material of the first sub-pattern 201 most proximal to the base substrate may also be different from the material of the first planarization layer 4. In addition, the sub-pattern of the spacer 2 most proximal to the base substrate may be the second sub-pattern 202, which falls within the scope of the present disclosure.

Figure 5:
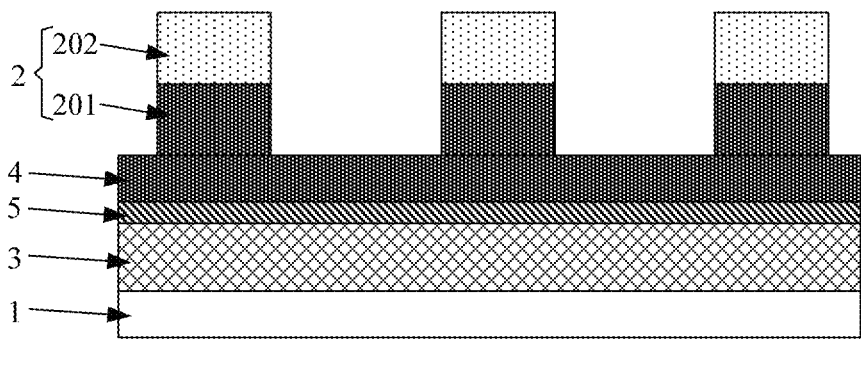
FIG. 5 is a schematic cross-sectional view of a display substrate according to another embodiment of the present disclosure.
Figure 6:
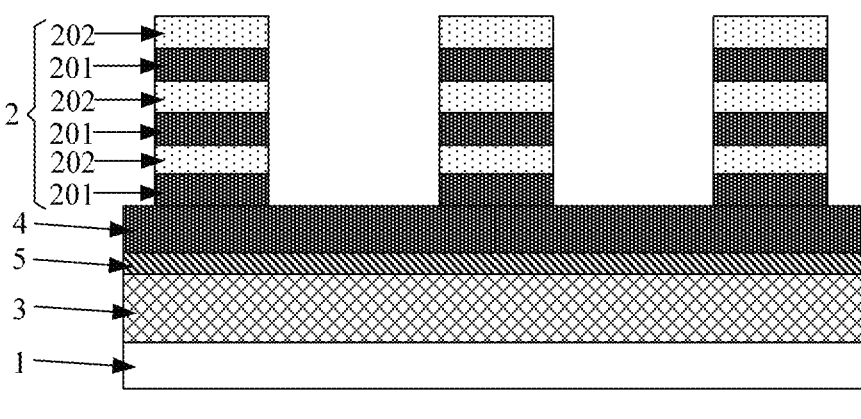
FIG. 6 is a schematic cross-sectional view of a display substrate according to another embodiment of the present disclosure.

FIG. 5 is a schematic cross-sectional view of a display substrate according to another embodiment of the present disclosure. FIG. 6 is a schematic cross-sectional view of a display substrate according to another embodiment of the present disclosure. As shown in FIG. 5 and FIG. 6, in some embodiments, the display substrate further includes a second planarization layer 5 between the display functional layer 3 and the first planarization layer 4, and a material of the second planarization layer 5 includes an inorganic material.

In the embodiment of the present disclosure, the second planarization layer 5 made of an inorganic material is formed below the first planarization layer 4, the second planarization layer 5 not only can realize the planarization function to some degree, but also can provide stable support for the spacers 2 thereabove, so as to improve the stability of the spacers 2.

Figure 7:
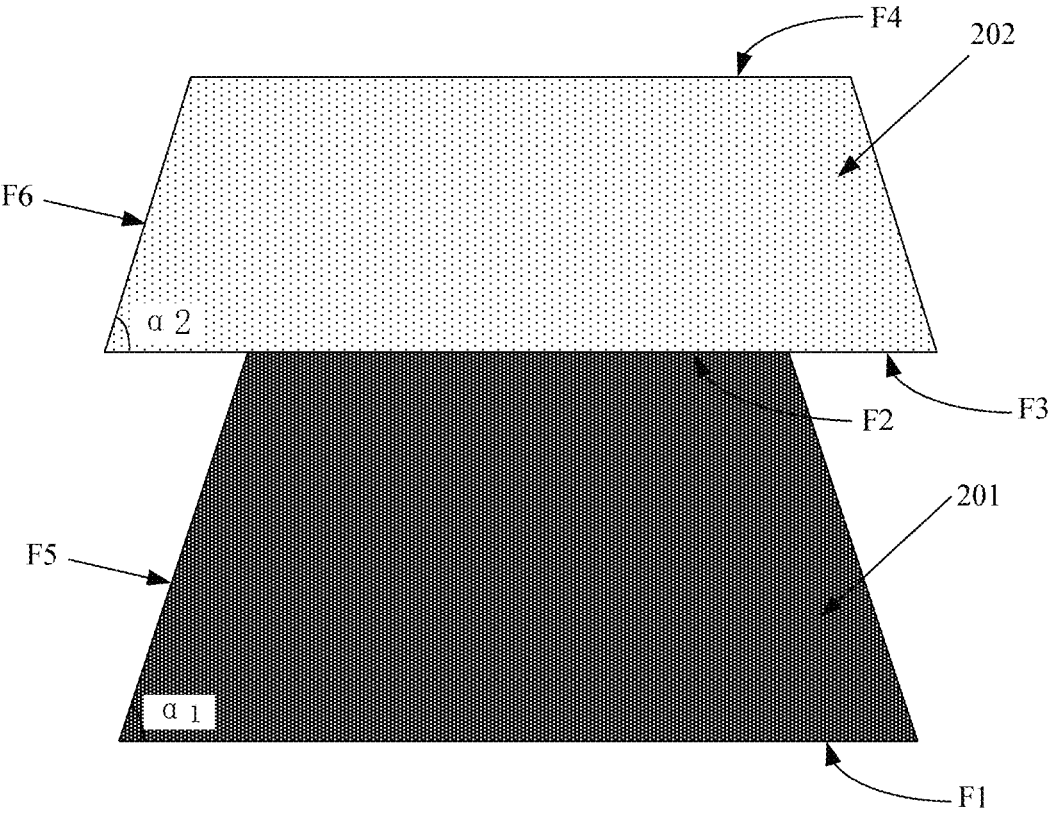
FIG. 7 is a schematic cross-sectional view of a first sub-pattern and a second sub-pattern adjacent to each other within a spacer according to an embodiment of the present disclosure.

FIG. 7 is a schematic cross-sectional view of a first sub-pattern and a second sub-pattern adjacent to each other within a spacer according to an embodiment of the present disclosure. As shown in FIG. 7, in some embodiments, the first sub-pattern 201 includes: a first surface F1 and a second surface F2 oppositely disposed in a normal direction of the base substrate 1, and the first surface F1 is closer to the base substrate 1 than the second surface F2. The second sub-pattern 202 includes: a third surface F3 and a fourth surface F4 oppositely disposed in the normal direction of the base substrate 1, and the third surface F3 is closer to the base substrate 1 than the fourth surface F4.

In the spacer 2, for one first sub-pattern 201 and one second sub-pattern 202 adjacent to the one first sub-pattern 201 and located on a side of the one first sub-pattern 201 away from the base substrate 1, an orthographic projection of the second surface F2 of the one first sub-pattern 202 on the base substrate 1 falls within an orthographic projection of the third surface F3 of the one second sub-pattern 201 on the base substrate 1. That is, an area of the second surface F2 of the one first sub-pattern 202 is smaller than or equal to an area of the third surface F3 of the one second sub-pattern 201 adjacent to the one first sub-pattern 202.

With continued reference to FIG. 7, the first sub-pattern 201 further includes a first sidewall F5 between the first surface F1 and the second surface F2; the second sub-pattern 202 further includes a second sidewall F6 between the third surface F3 and the fourth surface F4. An inclination angle $\alpha 1$ formed between the first sidewall F5 and the first surface F1 is smaller than or equal to an inclination angle $\alpha 2$ formed between the second sidewall F6 and the third surface F3.

In some embodiments, the inclination angle $\alpha 1$ formed between the first sidewall F5 and the first surface F1 ranges from 50° to 90°; the inclination angle $\alpha 2$ formed between the second sidewall F6 and the third surface F3 ranges from 75° to 90°.

With continued reference to FIG. 1A to FIG. 6, in some embodiments, a ratio of a sum of the thicknesses of all the first sub-patterns 201 in the spacer 2 to a sum of the thicknesses of all the second sub-patterns 202 in the spacer 2 ranges from 1:1 to 10:1. The larger the ratio is, the better the overall elasticity of the spacer 2 is; the smaller the ratio is, the better the overall resistance to compression of the spacer 2 is.

In some embodiments, the elastic recovery of the first sub-pattern 201 is greater than or equal to 75%.

In some embodiments, the material of the first sub-pattern 201 includes a resin material, and the material of the second sub-pattern 202 includes at least one of silicon oxide or silicon nitride.

It should be noted that, in the embodiment of the present disclosure, when the number of the first sub-patterns 201 in the spacer 2 is greater than or equal to 2, the materials for the first sub-patterns 201 may be the same or different. When the number of the second sub-patterns 202 in the spacer 2 is greater than or equal to 2, the materials for the second sub-patterns 202 may be the same or different. The material and thickness of the first sub-patterns 201 and the second sub-patterns 202 can be designed and adjusted in advance according to actual needs.

Based on the same inventive concept, an embodiment of the present disclosure provides a method for manufacturing a display substrate. FIG. 8 is a flowchart of a method for manufacturing a display substrate according to an embodiment of the present disclosure. As shown in FIG. 8, the manufacture method may be used for manufacturing the display substrate according to the previous embodiment, and the manufacture method includes steps S1 and S2.

At step S1, a base substrate is provided.

At step S2, spacers are formed on a side of the base substrate. Each of the spacers includes at least one first sub-pattern and at least one second sub-pattern which are stacked along a normal direction of the base substrate. The first sub-pattern is made of an organic material, and the second sub-pattern is made of an inorganic material.

FIG. 9 is a flowchart of a method for manufacturing a display substrate according to another embodiment of the present disclosure. As shown in FIG. 9, the manufacturing method shown in FIG. 9 may be used for manufacturing the display substrate shown in FIG. 1A and FIG. 2, the manufacturing method includes steps S1, S201a, and S202a.

At step S1, a base substrate is provided.

At step S201a, at least two material layers are formed on a side of the base substrate. The at least two material layers include at least one organic material layer and at least one inorganic material layer, and a material layer of the at least two material layers farthest away from the base substrate is an inorganic material layer.

In some embodiments, the material of the organic material layer is a resin material, and the material of the inorganic material layer is at least one of silicon oxide or silicon nitride.

At step S202a, a patterning process is performed on the at least two material layers through one dry patterning process or single dry patterning process, such that the organic material layer is patterned into a first pattern and the inorganic material layer is patterned into a second pattern.

At step S202a, a surface of the resulted structure in step S201a is coated with a photoresist firstly; an exposure process is performed on the photoresist by using an exposure machine; a development process is performed on the photoresist by using a developing solution; and a patterning process is performed on the at least two material layers formed in step S201a through a dry etching process.

Due to the difference in the materials of the inorganic material layer and the organic material layer, the process conditions (e.g., the type of process gas, the pressure, the process temperature, etc.) used when the inorganic color filter film is etched are different from the process conditions used when the inorganic color filter film is etched. Therefore, the process conditions need to be adjusted according to the type of the material layer to be etched in step S202a. It is emphasized that, when the process conditions are adjusted, it is not necessary to open the etching chamber of the dry etching equipment, but directly adjust the corresponding process conditions through the dry etching equipment, so the efficiency of the whole dry etching process is high.

FIG. 10 is a flowchart of a method for manufacturing a display substrate according to another embodiment of the present disclosure. As shown in FIG. 10, the manufacturing method shown in FIG. 10 may be used for manufacturing the display substrate shown in FIG. 3 and FIG. 4, the manufacturing method includes steps S1, S1b, and S2.

At step S1, a base substrate is provided.

At step S1b, a display functional layer is formed on a side of a base substrate.

For the related description of the display functional layer, reference may be made to the contents in the foregoing embodiments, and details thereof will not be described herein.

At step S2, a first planarization layer and spacers are formed on a side of the display functional layer away from the base substrate.

Figure 12A:
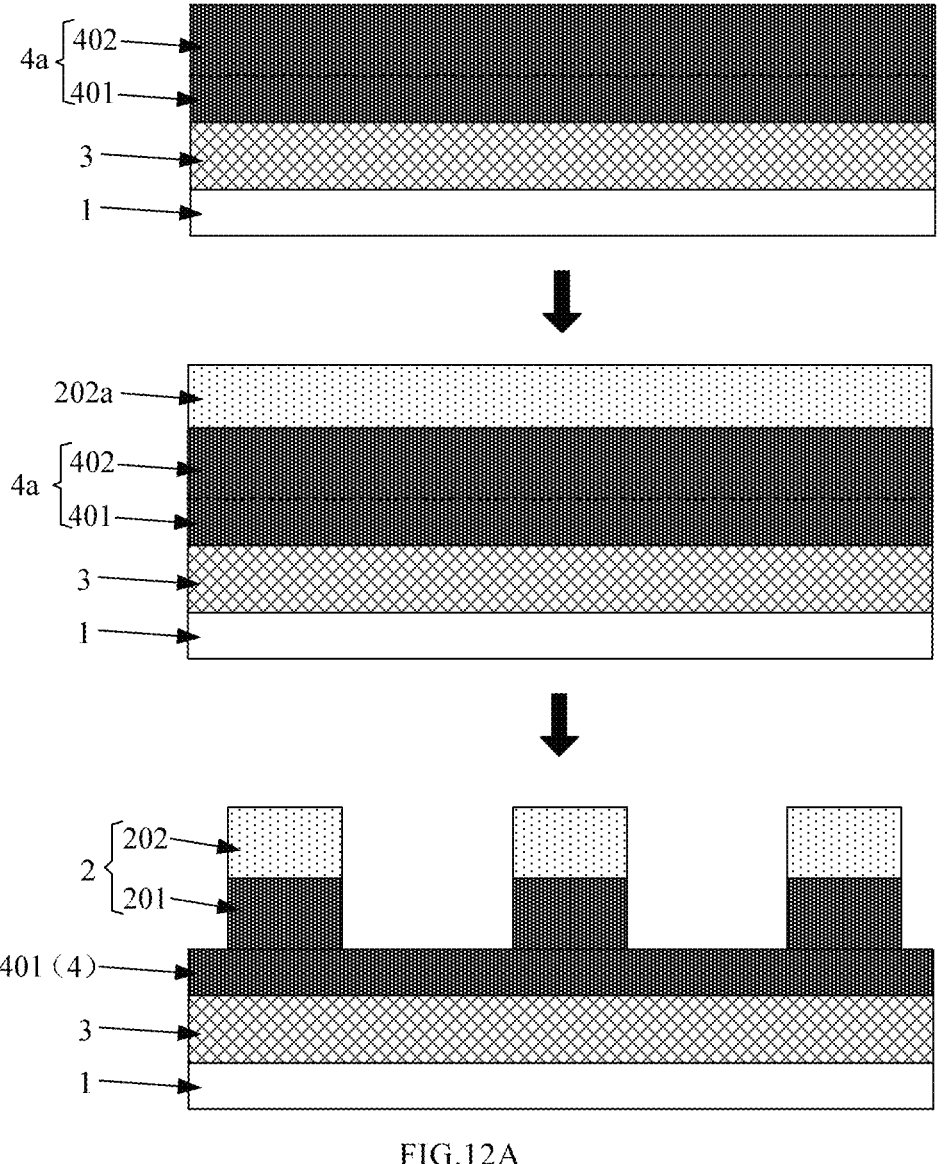
FIG. 12A is a schematic cross-sectional view showing intermediate structures of the display substrate shown in FIG. 3 formed through steps S201b to S203b in an embodiment of the present disclosure.
Figure 12B:
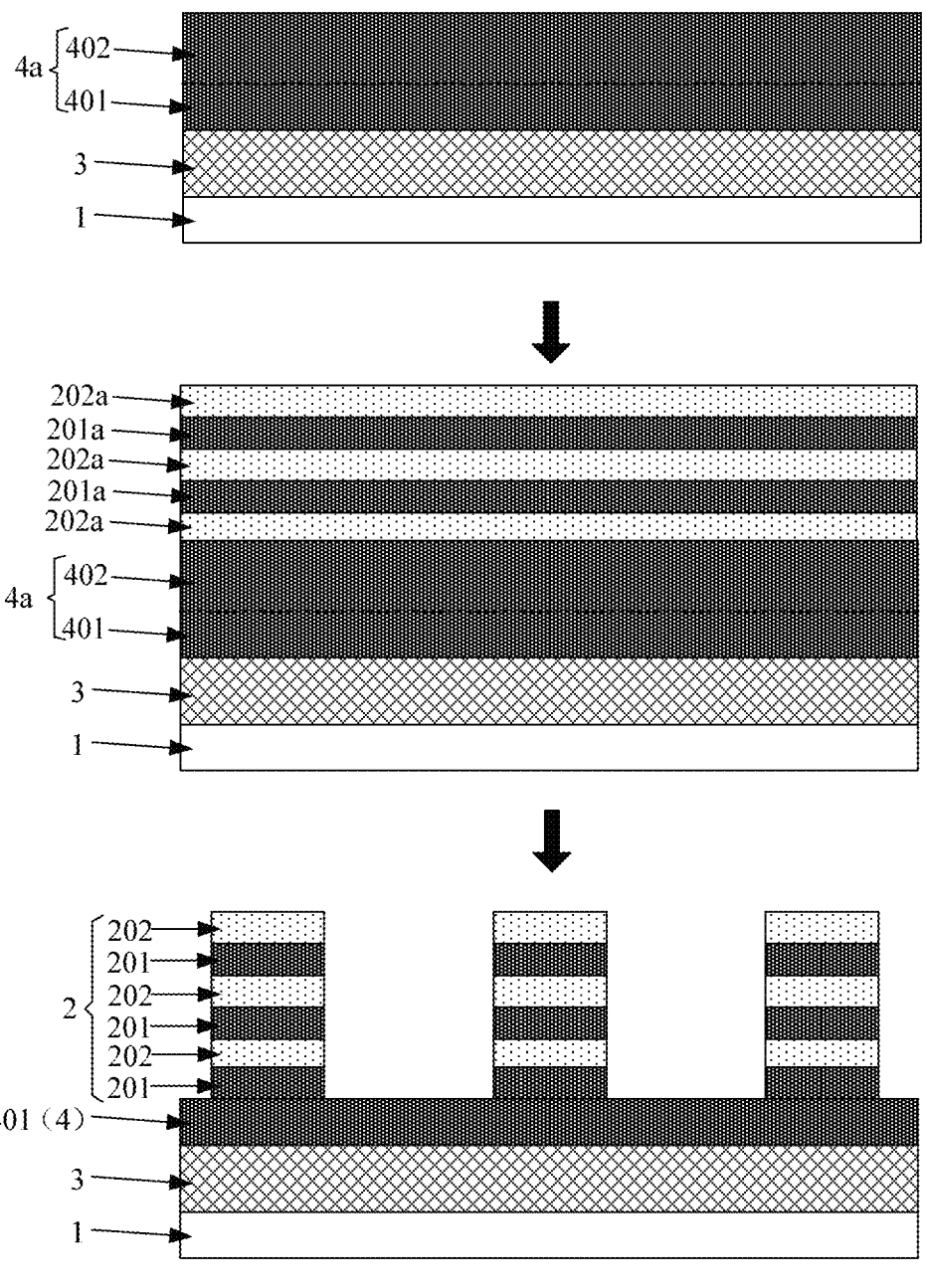
FIG. 12B is a schematic cross-sectional view showing intermediate structures of the display substrate shown in FIG. 4 formed through steps S201b to S203b in an embodiment of the present disclosure.

FIG. 11 is a flowchart of an alternative implementation method for forming a first planarization layer and spacers on a side of a display functional layer away from a base substrate according to an embodiment of the present disclosure. FIG. 12A is a schematic cross-sectional view showing intermediate structures of the display substrate shown in FIG. 3 manufactured through steps S201b to S203b in an embodiment of the present disclosure. FIG. 12B is a schematic cross-sectional view showing intermediate structures of the display substrate shown in FIG. 4 manufactured through steps S201b to S203b in an embodiment of the present disclosure. Referring to FIG. 11 to FIG. 12B, step S2 includes: step S201b to step S203b.

At step S201b, a first planarization material layer is formed on a side of the display functional layer away from the base substrate, and the first planarization material layer is made of an organic material.

The first planarization material layer 4a includes a planarization organic material layer 401 and a to-be-patterned organic material layer 402 located on a side of the planarization organic material layer 401 away from the base substrate. Both of the thickness of the planarization organic material layer 401 of the first planarization material layer 4a and the thickness of the to-be-patterned organic material layer 402 may be designed and adjusted in advance according to actual needs.

At step S202b, at least one material layer is formed on a side of the first planarization material layer away from the base substrate, and the at least one material layer includes at least one inorganic material layer.

Referring to FIG. 12A, when the spacer includes only one first sub-pattern and only one second sub-pattern, only one inorganic material layer 202a is formed in step S202b. In the conventional process for manufacturing a display substrate, an organic material layer for forming the spacer is generally formed on a first planarization layer; in the present disclosure, when the display substrate shown in FIG. 3 is manufactured, only one inorganic material layer 202a is formed on the first planarization layer through a single layer formation process. Therefore, the manufacturing method in the present disclosure does not result in an increase in process steps as compared to the conventional process for manufacturing the display substrate.

Referring to FIG. 12B, when a plurality of first sub-patterns and a plurality of second sub-patterns are formed in the spacer, at least two inorganic material layers 202a and at least one organic material layer 201a are formed by performing the layer formation process for several times.

At step S202b, the minimum thickness of the inorganic material layer is about 10 nm and the minimum thickness of the organic material layer is about 0.8 μm, according to the existing layer formation process.

At step S203b, the patterning process is performed on the at least one material layer and the to-be-patterned organic material layer through one dry patterning process, such that the inorganic material layer of the at least one material layer is patterned into the second pattern, the to-be-patterned organic material layer is patterned into the first pattern, and the planarization organic material layer serves as the first planarization layer.

Referring to FIG. 12A, when the spacer includes only one first sub-pattern and only one second sub-pattern, the inorganic material layer 202a formed in step S202b is patterned into the second pattern 202, the to-be-patterned organic material layer formed in step S201b is patterned into the first pattern 201, and the planarization organic material layer serves as the first planarization layer 4.

Referring to FIG. 12B, when the spacer includes a plurality of first sub-patterns and a plurality of second sub-patterns, the inorganic material layers 202a formed in step S202b are patterned into the second patterns 202, the organic material layers 201a formed in step S202b are patterned into the first patterns 201, the to-be-patterned organic material layer 402 formed in step S201b is patterned into the first pattern 201, and the planarization organic material layer 401 serves as the first planarization layer 4.

Figure 13:
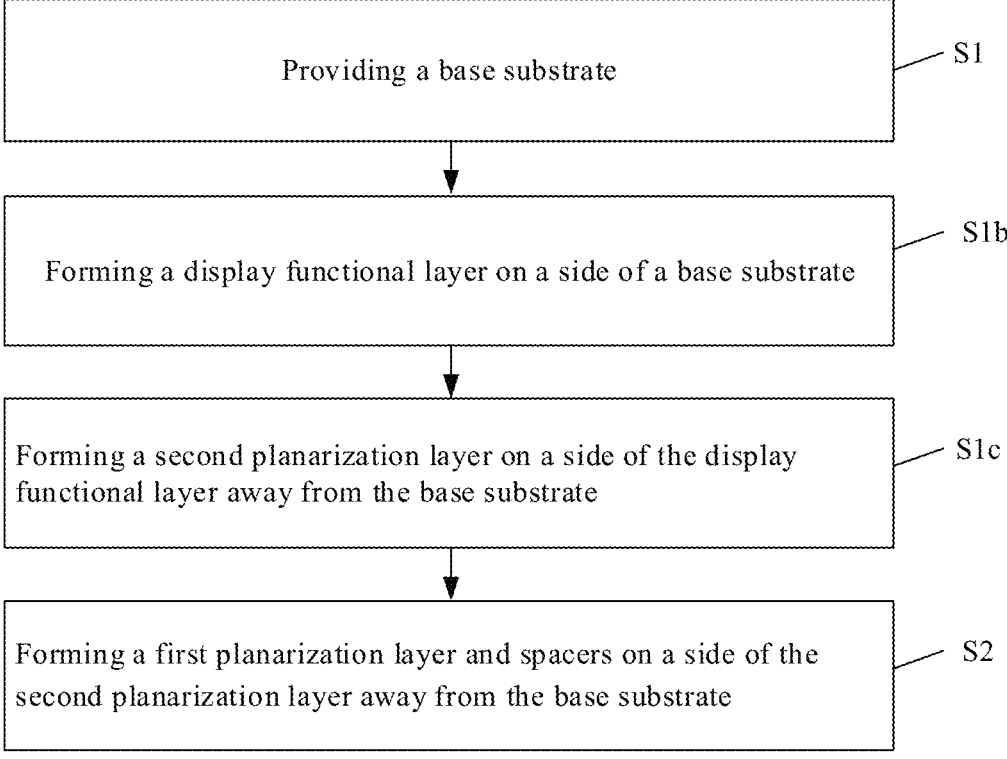
FIG. 13 is a flowchart of a method for manufacturing a display substrate according to another embodiment of the present disclosure.

FIG. 13 is a flowchart of a method for manufacturing a display substrate according to another embodiment of the present disclosure. As shown in FIG. 13, in addition to steps S1, S1b and S2 in the manufacture method shown in FIG. 9, the manufacture method shown in FIG. 13 further includes step S1c between step S1b and step S2. Only step S1c will be described in detail below.

At step S1c, the material of the second planarization layer includes an inorganic material.

The second planarization layer not only may realize a planarization function to some degree, but also may provide stable support for the spacers located above.

Based on the same inventive concept, an embodiment of the present disclosure further provides a display device. The display device includes: a display substrate, which is the display substrate in anyone of the previous embodiments; and a counter substrate opposite to the display substrate.

When the display substrate is an array substrate, the counter substrate may be a color filter substrate; and when the display substrate is a color filter substrate, the counter substrate is an array substrate.

It should be noted that the display device according to the embodiment may be any product or component having a display function, such as a liquid crystal display, a mobile phone, a tablet computer, a notebook computer, a digital photo frame, a navigator, etc.; the display device may further include other components, such as a data driving circuit, a timing controller, or the like, which are not limited in the embodiments of the present disclosure.

It should be noted that, in this document, relational terms such as first and second, or the like are used solely to distinguish one entity or operation from another entity or operation without necessarily requiring or implying any actual such relationship or order between such entities or operations. Also, the terms "include" "comprises" or any other variation thereof, are intended to cover a non-exclusive inclusion, such that a process, method, article, or apparatus that comprises a list of elements does not include only those elements but may include other elements not expressly listed or inherent to such process, method, article, or apparatus. Without further limitation, an element defined by the phrase "comprising an . . . " does not exclude the presence of other identical elements in the process, method, article, or apparatus that comprises the element.

According to embodiments of the present disclosure, as set forth above, these embodiments are not intended to be exhaustive or to limit the present disclosure to the precise embodiments disclosed. Obviously, many modifications and variations are possible in light of the above teaching. The embodiments are selected and described in detail in the specification in order to better explain the principle and practical application of the present disclosure, so that those skilled in the art can make good use of the present disclosure and its modification based on the present disclosure. The present disclosure is only limited by the claims and their full scope and equivalents.

What is claimed is:

1. A display substrate, comprising:
a base substrate; and
a plurality of spacers on a side of the base substrate and each comprising at least one first sub-pattern and at least one second sub-pattern stacked along a normal direction of the base substrate, the first sub-pattern being made of an organic material and the second sub-pattern being made of an inorganic material,
wherein each of the plurality of spacers comprises a plurality of first sub-patterns and a plurality of second sub-patterns stacked alternately on the base substrate,
wherein a ratio of a sum of thicknesses of all of the plurality of first sub-patterns of the spacer to a sum of thicknesses of all of the plurality of second sub-patterns of the spacer ranges from 1:1 to 10:1.

2. The display substrate of claim 1, wherein a sub-pattern of each of the plurality of spacers farthest away from the base substrate is the second sub-pattern.

3. The display substrate according to claim 1, further comprising:
a display functional layer between the base substrate and the spacers; and
a first planarization layer between the display functional layer and the spacers, wherein
the first planarization layer comprises an organic material.

4. The display substrate of claim 3, wherein
a sub-pattern of each of the plurality of spacers most proximal to the base substrate is the first sub-pattern, and
the sub-pattern of each of the plurality of spacers most proximal to the base substrate has the same material as the first planarization layer.

5. The display substrate of claim 3, further comprising: a second planarization layer between the display functional layer and the first planarization layer, wherein
the second planarization layer comprises an inorganic material.

6. The display substrate of claim 1, wherein each of the plurality of spacers has two to four second sub-patterns.

7. The display substrate of claim 1, wherein
the first sub-pattern comprises a first surface and a second surface oppositely disposed in the normal direction of the base substrate, and the first surface is closer to the base substrate than the second surface,
the second sub-pattern comprises a third surface and a fourth surface oppositely disposed in the normal direction of the base substrate, the third surface is closer to the base substrate than the fourth surface,
for the first sub-pattern in the spacer and the second sub-pattern adjacent to the first sub-pattern and located on a side of the first sub-pattern away from the base substrate, an orthographic projection of the second surface of the first sub-pattern on the base substrate falls within an orthographic projection of the third surface of the second sub-pattern on the base substrate.

8. The display substrate of claim 1, wherein
the first sub-pattern comprises a first surface and a second surface oppositely disposed in the normal direction of the base substrate, wherein the first surface is closer to the base substrate than the second surface, and the first sub-pattern further comprises a first sidewall between the first surface and the second surface,
the second sub-pattern comprises a third surface and a fourth surface oppositely disposed in the normal direction of the base substrate, wherein the third surface is closer to the base substrate than the fourth surface, and the second sub-pattern further comprises a second sidewall between the third surface and the fourth surface, and
an inclination angle formed between the first sidewall and the first surface is smaller than or equal to an inclination angle formed between the second sidewall and the third surface.

9. The display substrate of claim 8, wherein
the first sidewall and the first surface form the inclination angle in a range from 50° to 90° therebetween, and
the second sidewall and the third surface form the inclination angle in a range from 75° to 90° therebetween.

10. The display substrate of claim 1, wherein the first sub-pattern has an elastic recovery greater than or equal to 75%.

11. The display substrate of claim 1, wherein
the first sub-pattern comprises a resin material;
the second sub-pattern comprises at least one of silicon oxide or silicon nitride.

12. The display substrate of claim 1, wherein the display substrate is an array substrate or a color filter substrate.

13. A display device, comprising:
a display substrate, which is the display substrate of claim 1; and
a counter substrate opposite to the display substrate.

14. A method for manufacturing the display substrate, comprising:
providing a base substrate; and
forming a plurality of spacers on a side of the base substrate, such that each of the plurality of spacers comprise: a plurality of first sub-patterns and a plurality of second sub-patterns stacked alternately on the base substrate along a normal direction of the base substrate, with the first sub-patterns being made of an organic material and the second sub-patterns being made of an inorganic material, and a ratio of a sum of thicknesses of all of the plurality of first sub-patterns of the spacer to a sum of thicknesses of all of the plurality of second sub-patterns of the spacer ranges from 1:1 to 10:1.

15. The method of claim 14, wherein forming the plurality of spacers on the side of the base substrate comprises:
forming a plurality of material layers on the side of the base substrate, wherein the plurality of material layers comprise a plurality of organic material layers and a plurality of inorganic material layers stacked alternately along the normal direction of the base substrate, and a material layer of the plurality of material layers farthest away from the base substrate is an inorganic material layer; and
performing a patterning process on the plurality of material layers through one dry patterning process, such that the plurality of organic material layers are patterned into the first sub-patterns and the plurality of inorganic material layers are patterned into the second sub-patterns.

16. The method of claim 14, wherein after providing the base substrate, the method further comprises:
forming a display functional layer on a side of the base substrate; and
forming a first planarization layer on a side of the display functional layer away from the base substrate.

17. The method of claim 16, wherein forming the first planarization layer and forming the plurality of spacers comprise:
forming a first planarization material layer on a side of the display functional layer away from the base substrate, the first planarization material layer being made of an organic material and comprising a planarization organic material layer and a to-be-patterned organic material layer on a side of the planarization organic material layer away from the base substrate,
forming, at least two inorganic material layers and at least one organic material layer stacked alternately along the normal direction of the base substrate, on a side of the to-be-patterned organic material layer away from the planarization organic material layer, and
performing a patterning process on the at least two inorganic material layers, the at least one organic material layer, and the to-be-patterned organic material layer through one dry patterning process, such that the at least two inorganic material layers are patterned into the second sub-patterns, the at least one organic material layer is patterned into the first sub-patterns, the to-be-patterned organic material layer is patterned into the first sub-patterns, and the planarization organic material layer is formed as the first planarization layer.

* * * * *